United States Patent
Chen

(12) 
(10) Patent No.: US 8,284,537 B2
(45) Date of Patent: Oct. 9, 2012

(54) BATTERY CELL AND ELECTRONIC APPARATUS WITH ELECTROSTATIC DISCHARGE PROTECTION

(75) Inventor: Chien-Wen Chen, Hsinchu County (TW)

(73) Assignee: Simplo Technology Co., Ltd., Hsinchu County (TW)

( * ) Notice: Subject to any disclaimer, the term of this patent is extended or adjusted under 35 U.S.C. 154(b) by 165 days.

(21) Appl. No.: 12/849,201

(22) Filed: Aug. 3, 2010

(65) Prior Publication Data

US 2011/0228431 A1    Sep. 22, 2011

(30) Foreign Application Priority Data

Mar. 17, 2010 (TW) ................................. 99107780 A

(51) Int. Cl.
*H05F 3/02* (2006.01)
(52) U.S. Cl. ........................................ 361/220
(58) Field of Classification Search .......... 361/56, 361/220
See application file for complete search history.

(56) References Cited

U.S. PATENT DOCUMENTS

| | | | |
|---|---|---|---|
| 4,958,255 A * | 9/1990 | Pritchard | 361/212 |
| 5,319,523 A * | 6/1994 | Ganthier et al. | 361/753 |
| 5,841,637 A * | 11/1998 | Chhatwal | 361/753 |
| 6,241,537 B1 * | 6/2001 | Tate et al. | 439/108 |
| 7,692,932 B2 * | 4/2010 | Bisbikis et al. | 361/799 |
| 2001/0046801 A1 * | 11/2001 | Tate et al. | 439/181 |
| 2007/0121308 A1 * | 5/2007 | Chiang | 361/818 |
| 2010/0040947 A1 * | 2/2010 | Sennami et al. | 429/178 |
| 2010/0277879 A1 * | 11/2010 | Juan et al. | 361/753 |

FOREIGN PATENT DOCUMENTS

| | | |
|---|---|---|
| TW | M339787 | 9/2008 |
| TW | M345272 | 11/2008 |
| TW | M345273 | 11/2008 |

* cited by examiner

*Primary Examiner* — Ronald W Leja
(74) *Attorney, Agent, or Firm* — Rosenberg, Klein & Lee

(57) ABSTRACT

An electronic apparatus with electrostatic discharge protection includes: a conducting casing and a circuit board. The circuit board has a power ground node and a conditional conducting path, and is set inside the conducting casing. The conditional conducting path further includes: a conducting element and an electrostatic discharging component. One end of the conducting element is electrically connected to the conducting casing, and the electrostatic discharging component is electrically connected between another end of the conducting element and the power ground node. When the voltage variation between the two ends of the electrostatic discharging element reaches a preset condition, the electrostatic discharging component functions as a short circuit; otherwise, the electrostatic discharging element is equivalent to a high impedance element. The power ground node electrically connects to an electrode of a battery for using it as a vessel of receiving electrostatic charges.

5 Claims, 3 Drawing Sheets

BATTERY CELL AND ELECTRONIC APPARATUS WITH ELECTROSTATIC DISCHARGE PROTECTION

BACKGROUND OF THE INVENTION

1. Field of the Invention

The present invention relates to a battery cell and electronic apparatus with electrostatic discharge protection, especially to a battery cell and electronic apparatus utilizing a conditional conducting path to achieve electrostatic discharge protection.

2. Description of Related Art

Natural material may obtain or lose electrons through certain ways, e.g. friction or induction. Such kind of electrons is called static electricity. When positive or negative electrons accumulate gradually, a potential variation is cause a large current which may damage an electronic device in the discharge path permanently, build between the accumulated electrons and the environment surrounding them. Then a transfer phenomenon between different potentials through a discharge path occurs. This phenomenon is the so-called electrostatic discharge (ESD). This instant discharge may affect its circuitry function, and induce a malfunction of it.

However, it's hard to avoid the ESD phenomenon. During the process of manufacturing, producing, assembling, testing, storing and transporting an electronic device or an electronic system, electrostatic electricity will be unavoidably accumulated in the human body, instrument, storage equipment and/or the electronic device itself. As a result, when these objects contact to each other, a discharge path is formed and the electronic device or electronic system may suffer the damage from ESD. Besides, since more and more electronic products use the design of metal casing to comply with the requirement of specification (e.g. requirement of shielding magnetic interference) or to improve their exterior appearances, electrostatic charge will be more easily accumulated on the metal casing and consequently cause the ESD phenomenon.

Presently most designers strictly control the manufacturing environment free from the accumulation of electrostatic electricity and, more importantly, add the design of ESD protection to the electronic products, so as to prevent the electronic products at end users' hands from ESD damage. As to the design of ESD protection, one can improve the integrated circuit's tolerance to ESD and, most fundamentally, enhance the ESD protection through the design of the discharge path of ESD.

The prior arts (Taiwan patent number M345272, M345273 and M339787) disclose a design of casing that can discharge electrostatic electricity through a path to a system ground which then passes the electrostatic electricity to the ground terminal of a power socket through an adapter. This design can't provide ESD protection when the system ground doesn't connect to the adapter or the adapter doesn't connect to the ground terminal, and the circuit within the casing is still exposed to ESD damage.

Therefore, a further improvement to the design of ESD protection is necessary.

SUMMARY OF THE INVENTION

In view of the aforementioned problems, the present invention provides an electronic apparatus with a conditional conducting path for achieving ESD protection.

According to an embodiment of the present invention, a battery with ESD protection comprises: a conducting casing, a circuit board and a voltage source. The circuit board is installed inside the casing and includes a ground node and a conditional conducting path. The conditional conducting path connects the conducting casing and the ground node, and includes a conducting component having one end connected to the conducting casing and an ESD component connected between the other end of the conducting component and the ground node. When the voltage variation between the two ends of the conditional conduction path reaches a predetermined condition, the ESD component functions as a conducting component. When the voltage variation does not reach the predetermined condition, the ESD component functions as a high impedance component. The predetermined condition accords to the circuit characteristic of the ESD component. Besides, one electrode of the voltage source connects to the ground node to provide ESD protection during the ESD component becoming conductive.

According to another embodiment of the present invention, an electronic apparatus with ESD protection comprises: a conducting casing and a circuit board. The circuit board is installed inside the casing and includes a ground node and a conditional conducting path. The conditional conducting path connects the conducting casing and the ground node and includes a conducting component having one end connected to the conducting casing and an ESD component connected between the other end of the conducting component and the ground node. When the voltage variation between the two ends of the conditional conducting path reaches a predetermined condition, the ESD component functions as a conducting component (i.e. low impedance component). When the voltage variation does not reach the predetermined condition, the ESD component functions as a high impedance component to the ground node. The predetermined condition accords to the circuitry characteristic of the ESD component. Besides, the ground node connects to an electrode of a battery cell, so as to discharge electrostatic electricity to the battery cell.

Therefore, regarding to the afore-mentioned invention, when the predetermined condition is not satisfied, the ESD component functions as a high impedance component and prevents the conducting casing from electrically connecting to the electrode of the battery cell through the ground node. When the predetermined condition is satisfied, the ESD component functions as a conducting component to release electrostatic electricity from the conducting casing to the electrode of the battery cell through the ground node. Consequently, the battery pack and electronic apparatus with ESD protection of the present invention is realized.

These and other objectives of the present invention will no doubt become obvious to those of ordinary skill in the art after reading the following detailed description of the preferred embodiment that is illustrated in the various figures and drawings.

DETAILED DESCRIPTION OF THE PREFERRED EMBODIMENTS

The present invention applies to an electronic apparatus including a conducting casing, and utilizes a ground node of the electronic apparatus and an ESD component to discharge electrostatic electricity accumulated on the conducting casing. More specifically, under a normal situation without electrostatic discharge occurring, the ESD component functions as an open circuit to electrically separate the conducting casing from the ground node. Moreover, under a discharge situation, the ESD component functions as a short circuit to discharge the accumulated electrostatic charges on the conducting casing to the ground node.

Please note that there are several kinds of ground node such as a power ground node and a data signal ground node. The embodiments of the present invention use a power ground node to discharge electrostatic charges, so as to avoid the ESD damage to the electronic apparatus.

Figure 1:
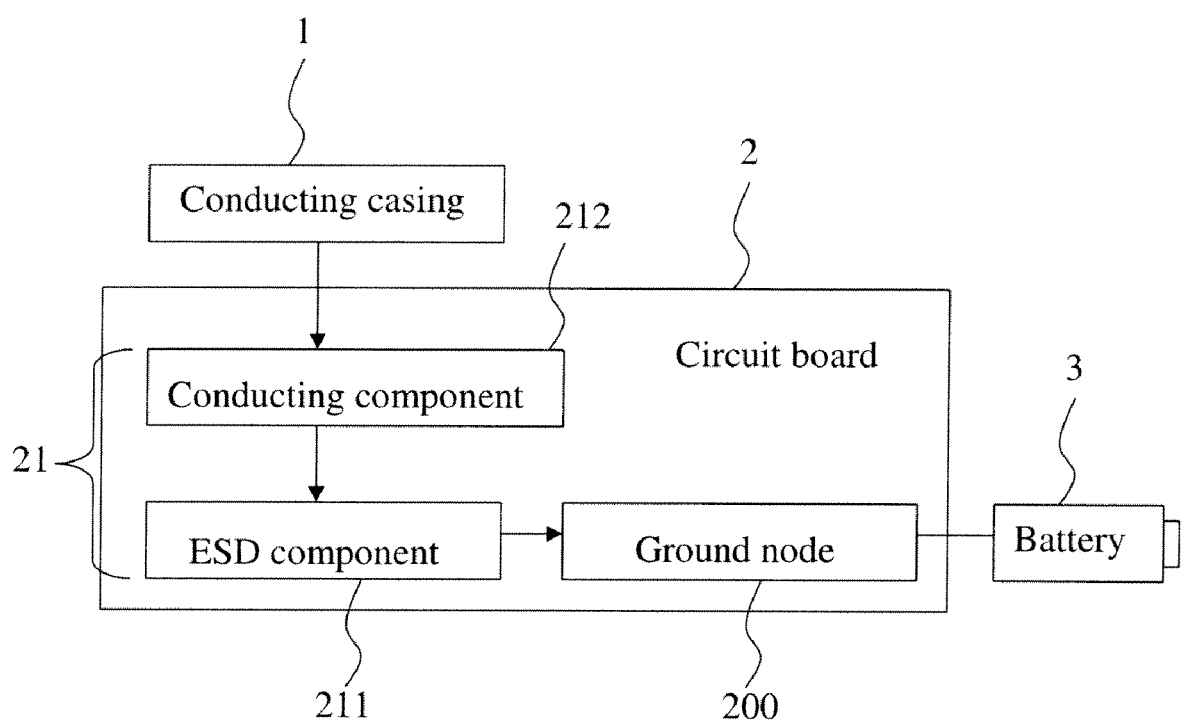
FIG. 1 illustrates an embodiment of the electronic apparatus with ESD protection of the present invention.

Please refer to FIG. 1 which illustrates an embodiment of an electronic apparatus with ESD protection of the present invention. As shown in FIG. 1, this embodiment takes a battery pack as the electronic apparatus for example. The battery pack is designed for an electronic/electric system and provides power for it, comprising: a conducting casing 1, a circuit board 2 and at least one battery cell 3. The conducting casing 1 could be made of conductive material (e.g. metal), or nonconducting material (e.g. plastic) with its surface being processed (e.g. electroplated) to be conductive.

The circuit board 2 is installed inside the conducting casing 1 as a part of the electronic apparatus, i.e. the battery pack. Besides, the circuit board 2 has a ground node 200 and a conditional conducting path 21. The ground node 200 in this embodiment is a power ground node and connects to a negative electrode of the battery cell 3, e.g. lithium battery cell, of the battery pack for using the battery cell 3 as a vessel of receiving electrostatic charges.

A person of ordinary skill in the art will appreciate that the electronic apparatus may use an internal power supply or an external power supply as a power source. The internal power supply could utilize the battery cell 3 to provide power for the electronic apparatus. The external power supply could utilize a power converting device such as a voltage modulator, DC/DC converter, and/or AC/DC converter to convert the power from a DC or AC power source to the power adaptable to the electronic apparatus. No matter what kind of power supply is adopted, the ground node 200 acts as a grounding circuit.

The conditional conducting path 21 further comprises: an electrostatic discharge (ESD) component 211 and a conducting element 212. The ESD component 211 has one end electrically connected to the ground node 200, and thereby the power supply of the electronic apparatus (i.e. the battery cell 3) and the ESD component cooperatively form a circuit configuration of parallel grounding. When the voltage variation between the two ends of the ESD component 211 (equivalent to the voltage variation between the two ends of the conditional conducting path 21) satisfies a predetermined condition such as a voltage level, the ESD component 211 acts as a low impedance circuit, but otherwise it acts as a high impedance circuit. In other words, the ESD component 211 functions as a short circuit when the voltage variation exceeds a threshold. Please note that the predetermined condition accords to the circuit characteristic of the above-mentioned ESD component 211. Furthermore, the specification of the predetermined condition is decided by choosing an adequate ESD component 211 according to the actual implementation which is not limited by the present invention.

A fastening end of the conducting component 212 electrically connects to another end of the ESD component 211 while a contact end of the conducting component 212 electrically connects to the conducting casing 1. Accordingly, the conditional conducting path 21 is formed between the conducting casing 1 and the ground node 200.

Please note that if the conducting casing 1 directly connects to the negative electrode of the battery cell 3, it will result in that the conducting casing 1 carries the potential of the negative electrode and thereby fails to comply with the safety requirement and causes the safety issue such as rising heat due to the current flowing between different electric potentials. Since the safety requirement is the first thing in designing a battery product, the present invention thereby provides the afore-described circuit structure including the conditional conducting path 21 to solve this safety issue. Based on the circuit structure, the ESD component 211 acts as a high impedance circuit similar to an open circuit when the voltage variation between the two ends of the ESD component 211 doesn't reach the predetermined condition. Since the ESD component 211 only conducts electricity when reaching the predetermined condition, the conditional conducting path 21 can effectively isolate the conducting casing 1 from the ground node 200 carrying the potential of the negative electrode in the other conditions, and thereby prevents the conducting casing 1 carrying potential the same as that of the ground node. Moreover, when the voltage variation satisfies the predetermined condition, the conditional conducting path 21 can effectively discharge the accumulated electrostatic electricity on the conducting casing 1 to the ground node 200 which electrically connects to the negative electrode of the battery cell 3, so as to fulfill the ESD protection.

Please note that the ESD component 211 can be a component comprising a capacitor, a varistor and/or a transient voltage suppressor (TVS) in the above-mentioned embodiment. However, this is not a limitation to the present invention. A person of ordinary skill in the art can utilize any kind of conditional conducting component to carry out this invention in accordance with the disclosure of this specification.

A person of ordinary skill in the art will appreciate that a capacitor can function as a high impedance circuit under a low frequency environment and function as a low impedance circuit under a high frequency environment. Therefore, a capacitor can be used as the ESD component 211 for discharging the electrostatic charges of the conducting casing 1 to the ground node 200 when the voltage variation per unit time reaches the predetermined condition.

Varistor (Voltage Dependent Resistor; VDR) works like an insulator of high impedance when it receives a voltage lower than a voltage level, and accordingly functions as an open circuit between the conducting casing 1 and the ground node 200 when the predetermined condition is unsatisfied. When the accumulated charges on the conducting casing 1 reach the predetermined condition, the voltage variation between the two ends of the varistor will have the varistor breakdown and act as a low impedance circuit to form a conduction path between the conducting casing 1 and the ground node 200 while the breakdown voltage relates to the circuit characteristic of the ESD component 211. Therefore, the conducting varistor can discharge the accumulated charges from the conducting casing 1 to the ground node 200.

Transient voltage suppressor is a resistor having a voltage-dependent characteristic and functioning like the afore-mentioned varistor. When the voltage variation increases to a voltage level (i.e. the conducting threshold of the ESD component 211), the impedance of the transient voltage suppressor rapidly decreases, so as to allow the accumulated charges on the conducting casing 1 passing through the transient voltage suppressor to the ground node 200. Besides, comparing to the varistor, the transient voltage suppressor has lower clamping voltage and thereby is able to discharge electricity to the ground node 200 more quickly.

Moreover, the fore-mentioned conducting element 212 could be implemented by one or any combination of conducting mechanical elements such as an elastic plate, a thimble, a screw and a spring. The fastening end of the conducting element 212 is firmly fixed to the circuit board 2 to electrically connect to the ESD component 211 while the contact end of the conducting element 212 electrically connects to the conducting casing 1.

Please note that any equivalent of the fore-mentioned implementation of the ESD component 211 and conducting element 212 can be used in the present invention.

Accordingly, a person of ordinary skill in the art can realize how to implement the present invention through the above-described embodiments.

Figure 2:
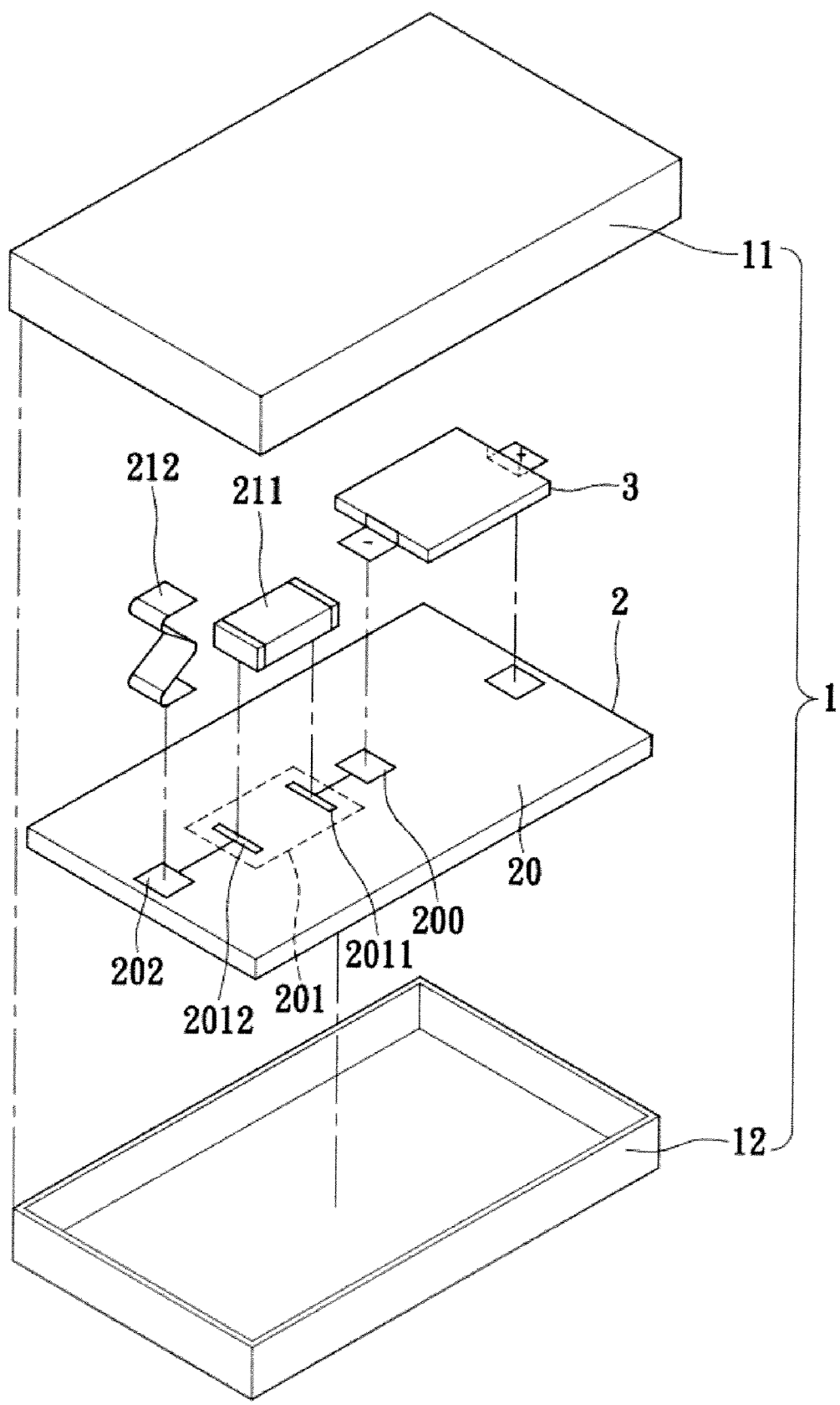
FIG. 2 is an explosion diagram showing an embodiment of the structure of the electronic apparatus with ESD protection of the present invention.

In order to illustrate the battery with ESD protection of the present invention, please refer to FIG. 2 which is an explosion diagram showing an embodiment of the battery with ESD protection.

As shown in FIG. 2, the conducting casing 1 comprises an upper lid 11 and a bottom lid 12 while the circuit board 2 is set between the upper and bottom lids 11, 12. Since the circuit board 2 connects to the upper lid 11 in this embodiment, the upper lid 11 of the conducting casing 1 is designed with conductive material or electroplated to have its all or part surface conductive while the bottom lid 12 could be conductive or not. Please note that the roles of the upper lid 11 and the bottom lid 12 can be switched, i.e. all or part of the bottom lid 12 conductive for contacting the circuit board 2 while the upper lid could be conductive or not. Other equivalent implementations can be adopted in the present invention.

The circuit board 2 comprises the ground node 200 and an ESD component fastening region 201 and a conducting element fastening region 202, which are formed through a printed circuit board manufacturing process, on an insulation surface 20 of it. The ESD component fastening region 201 further includes a first fastening node 2011 and a second fastening node 2012. The first fastening node 2011 and the second fastening node 2012 electrically connect to the ground node 200 and the conducting element fastening region 202 respectively through a circuit layout.

Furthermore, the circuit board 2 can utilize a process such as a surface mount technology (SMT) process to fasten the two ends of the ESD component 211 to the first fastening node 2011 and the second fastening node 2012 respectively, and have the fastening end of the conducting element 212 firmly connect to the conducting element fastening region 202. Any known methods that can secure the connections of the ESD component 211 and conducting element 212 could be adopted in the present invention.

The battery of this embodiment utilizes the voltage source 3 as the power supply source. A person of ordinary skill in the art will appreciate that the voltage source 3 can connect to the circuit board 2 through a well-known method such as soldering. Besides, since the present invention discharges electrostatic charges to the negative electrode of the voltage source 3 through the ground node 200, FIG. 2 shows the ground node 200 connecting to the negative electrode of the voltage source 3. Please note that if the power supply source of the electronic apparatus uses a power converting device to make use of an external power source, the power converting device may also have its connection secured through SMT process.

Accordingly, through the design of the present invention, when finishing the assembly of the battery, the upper lid 11 physically connects to the contact end of the conducting element 212 and electrically connects to the ground node 200 through the conditional conducting path 21 including the ESD component 211.

Moreover, take the implementation of a battery for illustration. In designing a battery, insulation design plays an important role because the conducting casing of the battery should not carry any charges in order to prevent the danger of short circuit. Therefore, the present invention provides a solution as following. When the voltage variation between the conducting casing 1 and the ground node 200 is higher than a preset voltage level, the conditional conducting path 21 will conduct electricity and function as a short circuit, so as to effectively discharge electrostatic charges to the ground node 200. When the voltage variation is lower than the preset voltage level, the conditional conducting path 21 will function as an open circuit, so as to prevent the conducting casing 1 from electrically connecting to the ground node 200 and carrying the potential of the ground node 200.

In addition, when the battery of the present invention is installed in a system (e.g. a computer system), the conducting casing 1 of the electronic apparatus can connect to the ground node of the system, so as to discharge electrostatic charges to the ground node of the system.

Figure 3:
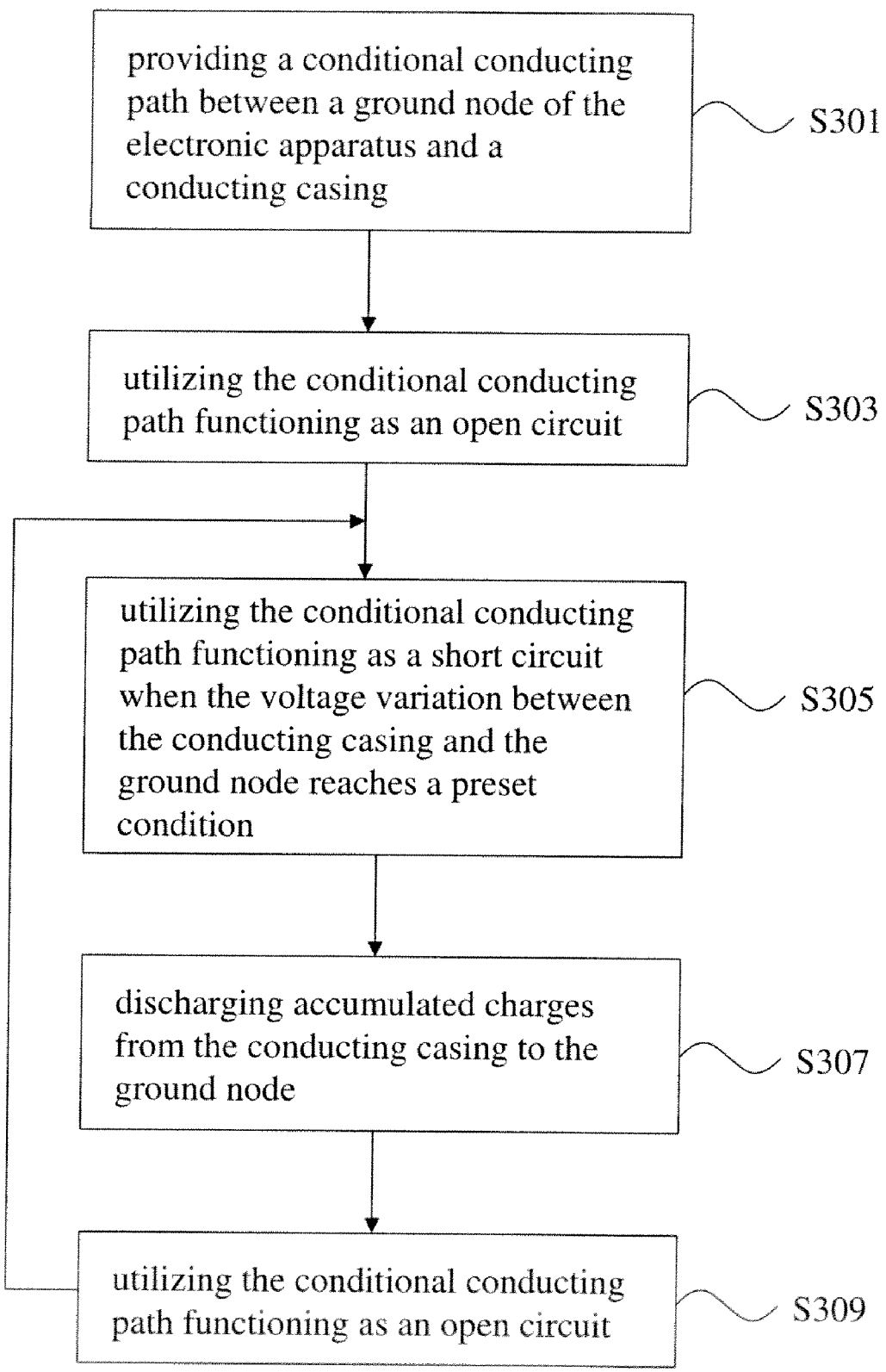
FIG. 3 shows a flow chart of an embodiment of the protection method applied to the electronic apparatus with ESD protection of the present invention.

Please refer to FIG. 3 which illustrates the protection method of the electronic apparatus with ESD protection of the present invention. The method comprises the step (S301) of providing a conditional conducting path between a ground node of the electronic apparatus and a conducting casing. The conditional conducting path comprises an ESD component which functions as a conducting component when the voltage variation between its two ends reaches a preset condition (e.g. a voltage level). However, under the condition of the voltage variation between the conducting casing and the ground node falling without the preset condition, the ESD component acts as a high impedance component, so as to isolate the conducting casing from the ground node.

Moreover, the conditional conducting path will continually function as an open circuit (S303) until the voltage variation between the conducting casing and the ground node reaches the preset condition. The conditional conducting path will then act as a short circuit (S305) to discharge accumulated charges from the conducting casing to the ground node (S307).

After step S307, the voltage variation between the conducting casing and the ground node will fall without the preset condition again and thereby the conditional conducting path functions as an open circuit (S309) due to the characteristic of the ESD component. Finally, repeat step S305 and its following steps such that the protection method of the current embodiment is fulfilled.

The aforementioned descriptions represent merely the preferred embodiment of the present invention, without any intention to limit the scope of the present invention thereto. Various equivalent changes, alterations, or modifications based on the claims of present invention are all consequently viewed as being embraced by the scope of the present invention.

What is claimed is:

1. A battery with electrostatic discharge protection, comprising:
   a case including a conductive part;
   a circuit board set inside the case and including a ground node and a conditional conducting path which connects between the conductive part and the ground node and comprises:
   a conducting component having one end physically contacting the conductive part; and an electrostatic discharge component connecting between another end of the conducting component and the ground node, functioning as a low impedance circuit when the voltage variation between the two ends of the electrostatic discharge component reaches a predetermined condition, and functioning as a high impedance circuit when the voltage variation between the two ends of the electrostatic discharge component falls without the predetermined condition, wherein the predetermined condition accords with the characteristic of the electrostatic discharge component; and a voltage source disposed inside the case and having one electrode electrically connecting to the ground node and receiving charges released from the conductive part to the ground node via the conditional conducting path.

2. The battery with electrostatic discharge protection of claim 1, wherein the electrode of the voltage source is a negative electrode.

3. The battery with electrostatic discharge protection of claim 2, wherein the electrostatic discharge component comprises at least one of a capacitor, a varistor and a transient voltage suppressor.

4. The battery with electrostatic discharge protection of claim 3, wherein the predetermined condition defines a voltage variation per unit time when the electrostatic discharge component is the capacitor and defines a voltage level when the electrostatic discharge component is the varistor or the transient voltage suppressor.

5. The battery with electrostatic discharge protection of claim 4, wherein the conducting component comprises one or any combination of an elastic plate, a thimble, a screw and a spring.

* * * * *